US011735093B2

(12) United States Patent
Kim et al.

(10) Patent No.: US 11,735,093 B2
(45) Date of Patent: Aug. 22, 2023

(54) SLEW RATE CONTROLLER, METHOD FOR DRIVING SLEW RATE CONTROLLER, DATA DRIVER INCLUDING SLEW RATE CONTROLLER, AND METHOD FOR DRIVING DATA DRIVER

(71) Applicant: LX Semicon Co., Ltd., Daejeon (KR)

(72) Inventors: Young Tae Kim, Daejeon (KR); Won Kim, Daejeon (KR); Taiming Piao, Daejeon (KR); Dong Hun Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/964,317

(22) Filed: Oct. 12, 2022

(65) Prior Publication Data

US 2023/0113898 A1 Apr. 13, 2023

(30) Foreign Application Priority Data

Oct. 12, 2021 (KR) ........................ 10-2021-0134953

(51) Int. Cl.
*H03F 3/45* (2006.01)
*G09G 3/3275* (2016.01)
*G09G 3/20* (2006.01)

(52) U.S. Cl.
CPC ... *G09G 3/2092* (2013.01); *G09G 2310/0275* (2013.01); *G09G 2310/0291* (2013.01); *G09G 2330/028* (2013.01)

(58) Field of Classification Search
CPC .......... G09G 3/20; G09G 3/36; G09G 3/2092; G09G 3/3233; G09G 3/3275; G09G 2310/0275; G09G 2310/0291; G09G 2330/028; G06F 3/038; H04N 5/70; H03K 3/037; H03K 3/356; H03K 5/04; H03K 5/12; H03K 5/24; H03K 17/16; H03K 19/00; H03K 19/0185; H03F 3/45; H03F 1/48
See application file for complete search history.

(56) References Cited

U.S. PATENT DOCUMENTS

2010/0231577 A1* 9/2010 Kim .................... G09G 3/3648 345/212
2020/0389165 A1* 12/2020 Sul ...................... H03K 17/161
2022/0238081 A1* 7/2022 Jung .................... G09G 3/3688
2022/0383823 A1* 12/2022 Lee ..................... H03F 3/45475

FOREIGN PATENT DOCUMENTS

KR 2012-0009565 A 2/2012
KR 2017-0014352 A 2/2017

* cited by examiner

*Primary Examiner* — Chanh D Nguyen
*Assistant Examiner* — Nguyen H Truong
(74) *Attorney, Agent, or Firm* — Polsinelli PC

(57) ABSTRACT

A slew rate controller includes an amplifier configured to operate with a first driving voltage and a second driving voltage, and generate an output voltage by using an image data voltage inputted at a first time point; an output switch configured to apply the output voltage to an external panel load according to a first control signal at the first time point; a first switch connected between one end of the output switch and the amplifier; and a second switch connected between the other end of the output switch and the amplifier.

20 Claims, 8 Drawing Sheets

SLEW RATE CONTROLLER, METHOD FOR DRIVING SLEW RATE CONTROLLER, DATA DRIVER INCLUDING SLEW RATE CONTROLLER, AND METHOD FOR DRIVING DATA DRIVER

BACKGROUND

1. Technical Field

Various embodiments generally relate to a slew rate controller, a method for driving the slew rate controller, a data driver including the slew rate controller, and a method for driving the data driver.

2. Related Art

In general, as the display technology is developed, various display devices of an active matrix type are provided, and among them, a liquid crystal display device and an organic light emitting display device are widely known. In particular, the organic light emitting display device includes an organic light emitting diode (hereinafter, referred to as an "OLED") which emits light by itself, and has advantages of fast response speed and large luminous efficiency, luminance and viewing angle.

The display device may include a data driver to generate an analog driving signal necessary for driving a display panel. The data driver may receive display data, generate an analog driving signal corresponding to the display data, and then supply the analog driving signal to the display panel.

In the case of the data driver for driving the display panel of the display device, due to an increase in load capacitance according to an increase in size of the display panel, a slew rate of an input voltage on the display panel is emerging as an important factor. In addition, since low power consumption is requested together with a fast slewing time, it is necessary to design a data driver to have a high slew rate, a fast slewing time or a fast settling time without increasing current consumption.

SUMMARY

Various embodiments are directed to reducing a delay time of an input voltage on a display panel according to a slew rate.

Also, various embodiments are directed to improve a slew rate of the input voltage inputted to the display panel in response to change in display data of continuous horizontal periods.

It is to be understood that technical objects to be achieved by embodiments are not limited to the aforementioned technical objects and other technical objects which are not mentioned herein will be apparent from the following description of the embodiments to one of ordinary skill in the art to which the disclosure pertains.

In an embodiment, a slew rate controller may include: an amplifier configured to operate with a first driving voltage and a second driving voltage, and include a first input terminal applied a first input voltage, a second input terminal applied a second input voltage and an output terminal outputting an output voltage; an output switch configured to turn-off in a first period and turn-on in a second period during a horizontal period including the initial first period and the remaining second period, and apply the output voltage to an external panel load in the second period; a first switch configured to switch a connection between the output terminal and the second input terminal of the amplifier, and turn-on during the second period; and a second switch configured to switch a connection between an external panel load and the second input terminal of the amplifier, and turn-on during the first period, wherein, when a difference between a first display data corresponding to the first input voltage and a second display data corresponding to a voltage charged to the panel load exceeds the preset value, the amplifier settles the output voltage of the output terminal as the first driving voltage or the second output voltage during the first period.

In an embodiment, a method for controlling a slew rate controller including an amplifier, which operates with a first driving voltage and a second driving voltage and includes a first input terminal, a second input terminal and an output terminal, an output switch, a first switch and a second switch may include: operating the amplifier as a comparator, in a first period of a horizontal period which includes the initial first period and the remaining second period, according to turn-off of the output switch and turn-on of the second switch which connects the second input terminal and an external panel load; and operating the amplifier as a buffer, in the second period, according to turn-on of the output switch and the first switch which connects the second input terminal and the output terminal of the amplifier, Wherein, when a difference between a first display data corresponding to a first input voltage of the first input terminal and a second display data corresponding to a voltage charged to the panel load exceeds the preset value, the amplifier operates as the comparator.

In an embodiment, a data driver may including: a latch circuit configured to include a first latch and a second latch, and sequentially latch the display data of continuous horizontal periods; a data comparator configured to compare a first display data of the first latch and a second display data of the second latch; a digital analog converter configured to output an image data voltage corresponding to the second display data; and a slew rate controller configured to receive the image data voltage as a first input voltage and be connected to an external panel load; wherein the slew rate controller comprises: an amplifier configured to operate with a first driving voltage and a second driving voltage, and include a first input terminal applied the first input voltage, a second input terminal applied a second input voltage and an output terminal outputting an output voltage; an output switch configured to turn-off in a first period and turn-on in a second period during a horizontal period including the initial first period and the remaining second period, and apply the output voltage to an external panel load in the second period; a first switch configured to switch a connection between the output terminal and the second input terminal of the amplifier, and turn-on during the second period; and a second switch configured to switch a connection between the external panel load and the second input terminal of the amplifier, and turn-on during the first period, wherein, when a difference between the first display data corresponding to the first input voltage and the second display data corresponding to a voltage charged to the panel load exceeds the preset value, the slew rate controller settles the output voltage of the output terminal of the amplifier as the first driving voltage or the second output voltage during the first period by operating as a comparator.

In an embodiment, a method for controlling a data driver including: a first step of determining by a data comparator whether a difference between a first display data of a first latch and a second display data of a second latch exceeds the preset value; a second step of operating a slew rate controller as a buffer or a comparator in according to the determining of the data comparator, wherein the slew rate controller includes an amplifier, an output switch, a first switch and a second switch, and the amplifier operates with a first driving voltage and a second driving voltage and includes a first input terminal, a second input terminal and an output terminal, wherein the second step comprising: a third step of operating the amplifier as a comparator, in a first period of a horizontal period which includes the initial first period and the remaining second period, according to turn-off of the output switch and turn-on of the second switch which connects the second input terminal and an external panel load; and a forth step of operating the amplifier as a buffer, in the second period, according to turn-on of the output switch and the first switch which connects the second input terminal and the output terminal of the amplifier, Wherein, when a difference between a first display data corresponding to a first input voltage of the first input terminal and a second display data corresponding to a voltage charged to the panel load exceeds the preset value, the amplifier operates as the comparator.

Accordingly, in the embodiments, the slew rate controller, the data driver including the slew rate controller and the method for driving the data driver may reduce a delay time according to a slew rate.

According to the embodiments, it is possible to improve a slew rate of the input voltage inputted to the display panel by controlling to settle an output terminal of an amplifier in response to change in display data of continuous horizontal periods.

Also, according to the embodiments, it is possible to reduce a delay time according to an improvement of the slew rate.

DETAILED DESCRIPTION

Hereinafter, a display device in accordance with an embodiment will be described with reference to FIG. 1.

Figure 1:
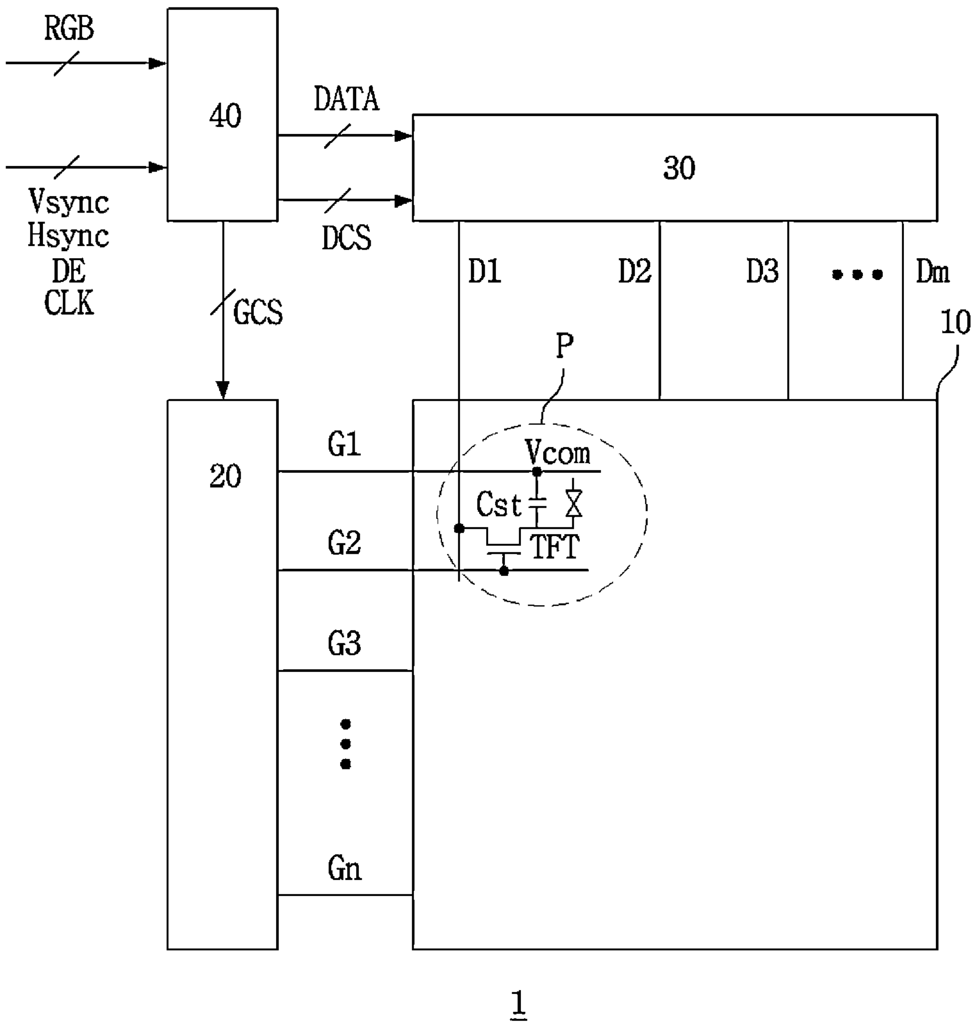
FIG. 1 is a block diagram illustrating the configuration of a display device in accordance with an embodiment.

FIG. 1 is a block diagram illustrating a display device in accordance with an embodiment.

Referring to FIG. 1, the display device 1 in accordance with the embodiment includes a display panel 10, a gate driver 20, a data driver 30, and a timing controller 40.

The display panel 10 includes a plurality of gate lines G1 to Gn, a plurality of data lines D1 to Dm which are arranged to intersect with each other so as to define a plurality of pixel regions P, and pixels which are disposed in the plurality of pixel regions P, respectively. The plurality of gate lines G1 to Gn may be arranged in a horizontal direction, and the plurality of data lines D1 to Dm may be arranged in a vertical direction. However, the embodiment is not limited thereto. The display panel 10 includes thin film transistors TFT which are formed in the plurality of pixel regions P, respectively, defined by the plurality of gate lines G1 to Gn and the plurality of data lines D1 to Dm, and a plurality of pixels which are electrically connected to the thin film transistors TFT, respectively.

The thin film transistors TFT supply data signals, supplied through the plurality of data lines D1 to Dm, to the corresponding pixels according to scan signals supplied through the plurality of gate lines G1 to Gn.

Each pixel may be configured by red, green, blue and white subpixels. In an embodiment, the respective subpixels may be repeatedly formed in a row direction or may be formed in a 2*2 matrix form. A color filter corresponding to each color is disposed in each of the red, green and blue subpixels, but a separate color filter is not disposed in the white subpixel. In an embodiment, the red, green, blue and white subpixels may be formed at the same area ratio, or may be formed at different area ratios.

The gate driver 20 includes a shift register which sequentially generates a scan signal, that is, a gate signal of an enable level, according to the gate control signal GCS of the timing controller 40. The thin film transistor TFT is turned on according to the scan signal of the enable level. The gate driver 20 may be disposed on one side of the display panel 10, for example, the left side of the display panel 10. However, the embodiment is not limited thereto, and the gate driver 20 may be disposed on the left and right sides of the display panel 10 to face each other. The gate driver 20 may include a plurality of gate driver integrated circuits (ICs) (not illustrated). The gate driver 20 may be implemented in the form of a tape carrier package in which the gate driver ICs are mounted. However, the embodiment is not limited thereto, and the gate driver ICs may be directly mounted to the display panel 10.

The data driver 30 converts display data of the timing controller 40 into an analog driving signal, and outputs the analog driving signal to the display panel 10. In detail, the data driver 30 may output the analog driving signal to each of the plurality of data lines D1 to Dm in response to a source output enable signal (SOE) included in a data control signal DCS of the timing controller 40. The data driver 30 may be disposed on one side of the display panel 10, for example, the top side of the display panel 10. However, the embodiment is not limited thereto, and the data driver 30 may be disposed on one side and the other side, for example, both the top and bottom sides, of the display panel 10 to face each other. The detailed configuration of the data driver 30 will be described later.

The timing controller 40 may receive a timing signal including a vertical synchronization signal Vsync, a horizontal synchronization signal Hsync, a data enable signal DE and a clock signal CLK from the outside. The timing controller 40 generates the data control signal DCS for controlling the data driver 30 and the gate control signal GCS for controlling the gate driver 20.

The data control signal DCS may include a data start pulse (DSP), a data sampling clock (DSC) and a source output enable signal (SOE). The data start pulse (DSP) controls the data sampling start timing of the data driver 30. The data sampling clock (DSC) is a clock signal which controls data sampling timing in the data driver. The source output enable signal (SOE) controls the output timing of the driving signal for each horizontal period of the data driver.

The timing controller 40 receives an image data signal RGB from the outside, converts the image data signal RGB into display data DATA capable of being processed by the data driver 30, and outputs the converted the display data DATA.

Hereinafter, a data driver 30 in accordance with an embodiment will be described with reference to FIG. 2.

Figure 2:
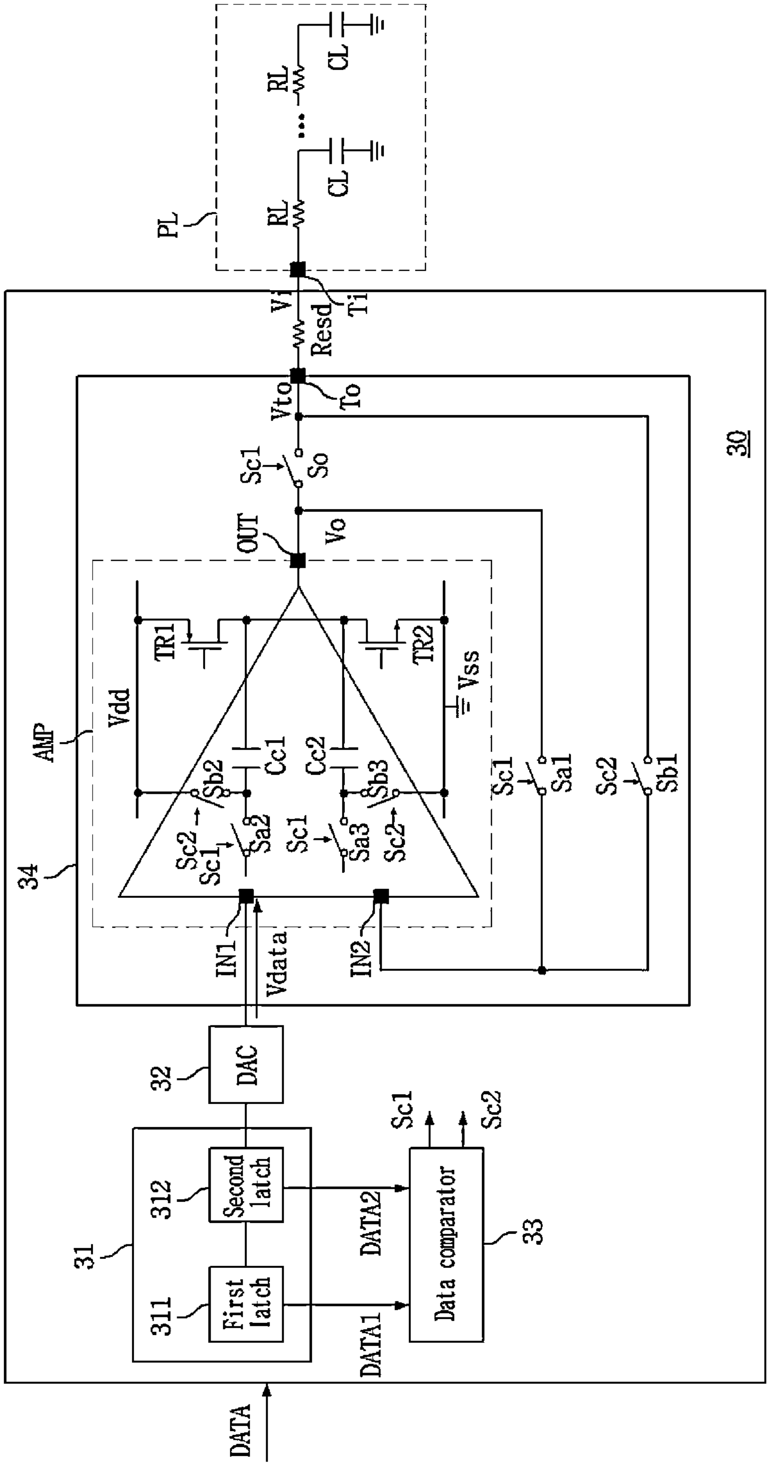
FIG. 2 is a block diagram illustrating the partial configuration of a data driver in accordance with an embodiment.

FIG. 2 is a diagram illustrating the partial configuration of a data driver 30 in accordance with an embodiment.

Referring to FIG. 2, the data driver 30 in accordance with the embodiment includes a latch circuit 31, a digital-analog converter (DAC) 32, a data comparator 33, a slew rate controller 34, and a protection resistor Resd. The data driver 30 may generate an analog driving signal as an output voltage Vto by using the display data DATA. The data driver 30 may apply an input voltage corresponding to one of the plurality of data lines D1 to Dm of the display panel 10, as an input voltage Vi.

In the case of FIG. 2, the load of the data driver 30 may be understood as being caused by one data line of the display 10 and pixels formed therein. The load of the data driver 30 may be defined as a panel load PL, and the panel load PL may be modeled to include a plurality of parasitic resistors RL and a plurality of parasitic capacitors CL. The input voltage Vi may be applied to a panel load PL through an input terminal Ti of the display panel 10.

The data driver 30 may receive the display data DATA of continuous horizontal periods and generate an output voltage Vto corresponding to each horizontal period.

The latch circuit 31 may include a first latch 311 and a second latch 312. The first latch 311 may sequentially latch the display data DATA of continuous horizontal periods and sequentially output the latched image data DATA to the DAC 32.

The first latch 311 may latch first display data DATA1 and output the latched first display data DATA1 to the second latch 312 and the data comparator 33. The first display data DATA1 may be defined as data of an nth horizontal period.

The second latch 312 may latch second display data DATA2 and output the latched second display data DATA2 to the DAC 32 and the data comparator 33. The second display data DATA2 may be defined as data of an n-lth horizontal period. The second display data DATA2 of the second latch 312 is data that is faster by one horizontal period than the first display data DATA1 of the first latch 311.

The DAC 32 may convert display data DATA, that is provided from the second latch 312, into an image data voltage Vdata.

The data comparator 33 may receive the first display data DATA1 and the second display data SATA2 and compare the first display data DATA1 and the second display data DATA2. The data comparator 33 may generate a first control signal Sc1 and a second control signal Sc2 according to a result of comparing the first display data DATA1 and the second display data DATA2. The first control signal SC1 may have a phase opposite to that of the second control signal SC2. The first control signal SC1 and the second control signal SC2 are for controlling the slew rate controller 34 to operate as either a comparator or a buffer.

Although not shown in the figures, the data comparator 33 may receive the source output enable signal SOE and generate the first control signal SC1 and the second control signal SC2 in synchronized with the level transition timing of the source output enable signal SOE. The source output enable signal SOE may maintain an enable level in initial period of the horizontal period and a disable level in the remaining period of the horizontal period. Hereafter, the enable level is defined as a high level, and the disable level is defined as a low level.

When the source output enable signal SOE is the enable level, the data comparator 33 may provide the first control signal SC1 and the second control signal SC2 so that the slew rate controller 34 operates as either the comparator or the buffer according to the comparison result of the first display data DATA1 and the second display data DATA2.

For example, when the source output enable signal SOE is the enable level and the difference between the first display data DATA1 and the second display data DATA2 is equal to or smaller than a preset value, the data comparator 33 may generate the first control signal Sc1 of the enable level and generate the second control signal Sc2 of the disable level. In this case, the slew rate controller 34 may operate as the buffer. When the source output enable signal SOE is the enable level and the difference between the first display data DATA1 and the second display data DATA2 exceeds the preset value, the data comparator 33 may generate the first control signal Sc1 of the disable level and generate the second control signal Sc2 of the enable level. In this case, the slew rate controller 34 may operate as the comparator. And, when the source output enable signal SOE is the disable level, the slew rate controller 34 may provide the first control signal Sc1 of the enable level and generate the second control signal Sc2 of the disable level so that the slew rate controller 34 operates as the buffer.

For the sake of convenience in explanation, the data comparator 33 has been described as a separate component. However, the embodiment is not limited thereto, and the data comparator 33 may be replaced with the timing controller 40.

The slew rate controller 34 includes an amplifier AMP, an output switch So, a switch Sa1 and a switch Sb1. When operated as the buffer, the slew rate controller 34 may generate an output voltage Vto corresponding to the image data voltage Vdata according to the first control signal Sc1. Also, when operated as the comparator, the slew rate controller 34 may settle an output voltage Vo of a internal amplifier as a first driving voltage Vdd or a second driving voltage Vss according to the second control signal Sc2.

The amplifier AMP may include a first input terminal IN1, a second input terminal IN2 and an output terminal OUT. The amplifier AMP operate with the first driving voltage Vdd and the second driving voltage Vss. The first driving voltage Vdd may be a high-level operating voltage, and the second driving voltage Vss may be a low-level ground voltage. The amplifier AMP may generate the output voltage Vo by using the inputted image data voltage Vdata according to the first control signal Sc1. The amplifier AMP may settle the output voltage Vo of the output terminal OUT as the first driving voltage Vdd or the second driving voltage Vss according to the second control signal Sc2.

The output switch So is connected between the output terminal OUT of the amplifier AMP and the output terminal To of the slew rate controller 34. The output switch So is switched by the source output enable signal SOE.

When the slew rate controller 34 is operated as the buffer, the output switch is turned-on by the source output enable signal SOE of the enable level, the output voltage Vo of the amplifier AMP is applied to the panel load PL according to source output enable signal SOE. The panel load PL may be charged by the input voltage Vi corresponding to the output voltage Vo. When the slew rate controller 34 is operated as the comparator, the output switch is turned-off by the source output enable signal SOE of the disable level, the output voltage Vo of the amplifier AMP may be settled to the output terminal OUT of the amplifier AMP.

The switch Sa1 is connected between the output terminal OUT and the second input terminal IN2 of the amplifier AMP. In other words, the switch Sa1 is for switching a connection of the output terminal OUT and the second input terminal IN2 of the amplifier AMP. The switching operation of the switch Sa1 may be controlled according to the first control signal Sc1. When the switch Sa1 is turned-on, the output voltage Vo feedbacks to the second input terminal IN2, and the slew rate controller 34 is operated as the buffer.

The switch Sb1 is connected between the output terminal To of the slew rate controller 34 and the second input terminal IN2 of the amplifier AMP. In other words, the switch Sb1 is for switching a connection of the output terminal To of the slew rate controller 34 and the second input terminal IN2 of the amplifier AMP. The switching operation of the switch Sb1 may be controlled according to the second control signal Sc2. When the switch Sa2 is turned-on, the second input terminal IN2 of the amplifier AMP is connected with the panel load PL through the switch Sb1 and the output terminal To of the slew rate controller 34, and the charged voltage to the panel load PL is applied to the second input terminal IN2 of the amplifier AMP. The slew rate controller 34 is operated as the comparator.

The amplifier AMP further includes a switch Sa2, a switch Sa3, a switch Sb2, a switch Sb3, compensation capacitors Cc1 and Cc2, a transistor TR1 and a transistor TR2, and operates using the first driving voltage Vdd and the second driving voltage Vss. The amplifier AMP may generate the output voltage Vo by using a first input voltage applied to the first input terminal IN1 and a second input voltage applied to the second input terminal IN2. The amplifier AMP may transfer the output voltage Vo to the output switch So through the output terminal OUT. For example, the amplifier AMP may transfer the output voltage Vo which is generated by using the image data voltage Vdata according to the first control signal Sc1, to the output switch So. Also, the amplifier AMP may transfer the first driving voltage Vdd or the second driving voltage Vss as the output voltage Vo to the output switch So according to the second control signal Sc2. The first input terminal IN1 may be a non-inverting input terminal and the second input terminal IN2 may be an inverting input terminal, but the embodiment is not limited thereto.

The switching operation of the switch Sa2 may be controlled according to the first control signal Sc1.

The switching operation of the switch Sa3 may be controlled according to the first control signal Sc1.

The switch Sb2 is connected between one end of the compensation capacitor Cc1 and the first driving voltage Vdd. The switching operation of the switch Sb2 may be controlled according to the second control signal Sc2.

The switch Sb3 is connected between one end of the compensation capacitor Cc2 and the second driving voltage Vss. The switching operation of the switch Sb3 may be controlled according to the second control signal Sc2.

The transistor TR1 and the transistor TR2 may generate the output voltage Vo corresponding to input voltages of the first input terminal IN1 and the second input terminal IN2.

The transistor TR1 may be connected between the first driving voltage Vdd and the output terminal OUT. The transistor TR1 may be a PMOS transistor.

The transistor TR2 may be connected between the output terminal OUT and the second driving voltage Vss. The transistor TR2 may be an NMOS transistor.

The compensation capacitors Cc1 and Cc2 may stabilize the frequency characteristics of the output voltage Vo so that the output voltage Vo of the amplifier AMP does not oscillate.

The compensation capacitor Cc1 is connected between the switch Sa2 and the drain of the transistor TR1.

The compensation capacitor Cc2 is connected between the switch Sa3 and the source of the transistor TR2.

For the sake of convenience in explanation, it has been described that the output switch So is connected between the amplifier AMP and the output terminal To. However, the embodiment is not limited thereto, and the output switch So may be a multiplexer.

The protection resistor Resd is a resistor for protecting the internal elements of the data driver 30 from static electricity or the like. The protection resistor Resd is connected between the output switch So and the input terminal Ti.

Hereinafter, a case in which a slew rate controller in accordance with an embodiment operates as an amplifier will be described with reference to FIGS. 2 and 3.

Figure 3:
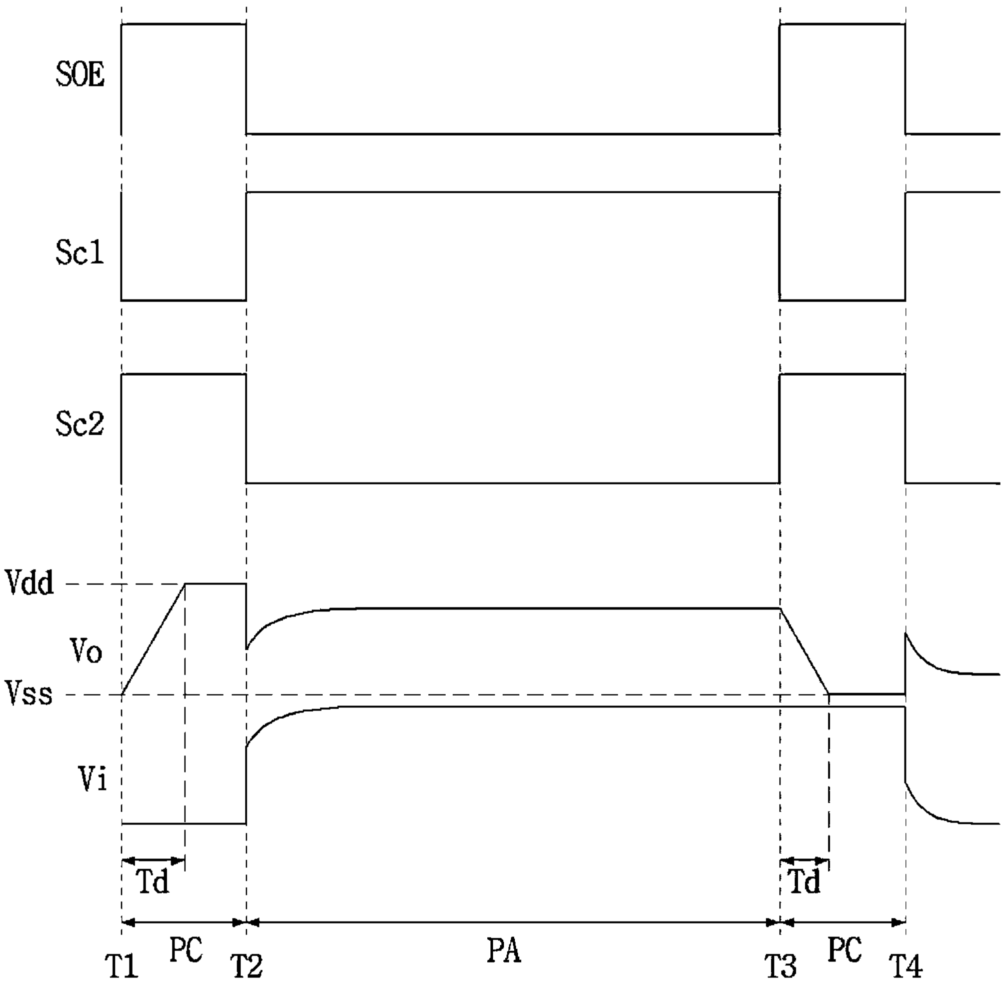
FIG. 3 is an operation timing diagram of a slew rate controller in accordance with an embodiment.

FIG. 3 is an operation timing diagram of a slew rate controller in accordance with an embodiment.

When the difference between the first display data DATA1 and the second display data DATA2 exceeds the preset value, the data comparator 33 generates the first control signal Sc1 of a disable level and generates the second control signal Sc2 of an enable level, at a first time point T1 when the source output enable signal SOE becomes an enable level. Accordingly, the slew rate controller 34 may operate as a comparator. The second control signal Sc2 may be inverted from an enable level (e.g., a high level) to a disable level (e.g., a low level) or from a disable level to an enable level in synchronization with the source output enable signal SOE. According to the first control signal Sc1 of the disable level, the output switch So, the switch Sa1, the switch Sa2 and the switch Sa3 are turned-off. According to the second control signal Sc2 of the enable level, the switch Sb1, the switch Sb2 and the switch Sb3 are turned-on.

At a second time point T2, the data comparator 33 generates the first control signal Sc1 of the enable level and generates the second control signal Sc2 of the disable level. According to the first control signal Sc1 of the enable level, the output switch So, the switch Sa1, the switch Sa2 and the switch Sa3 are turned-on. According to the second control signal Sc2 of the disable level, the switch Sb1, the switch Sb2 and the switch Sb3 are turned-off. Accordingly, the slew rate controller 34 operates as the buffer, and thereby, generates the output voltage Vto corresponding to the image data voltage Vdata inputted to the first input terminal IN1.

The plurality of parasitic capacitors CL may be charged according to the input voltage Vi corresponding to the generated output voltage Vto.

Hereinafter, the operation of the slew rate controller in accordance with the embodiment will be described with reference to FIGS. 4 to 6.

Figure 4:
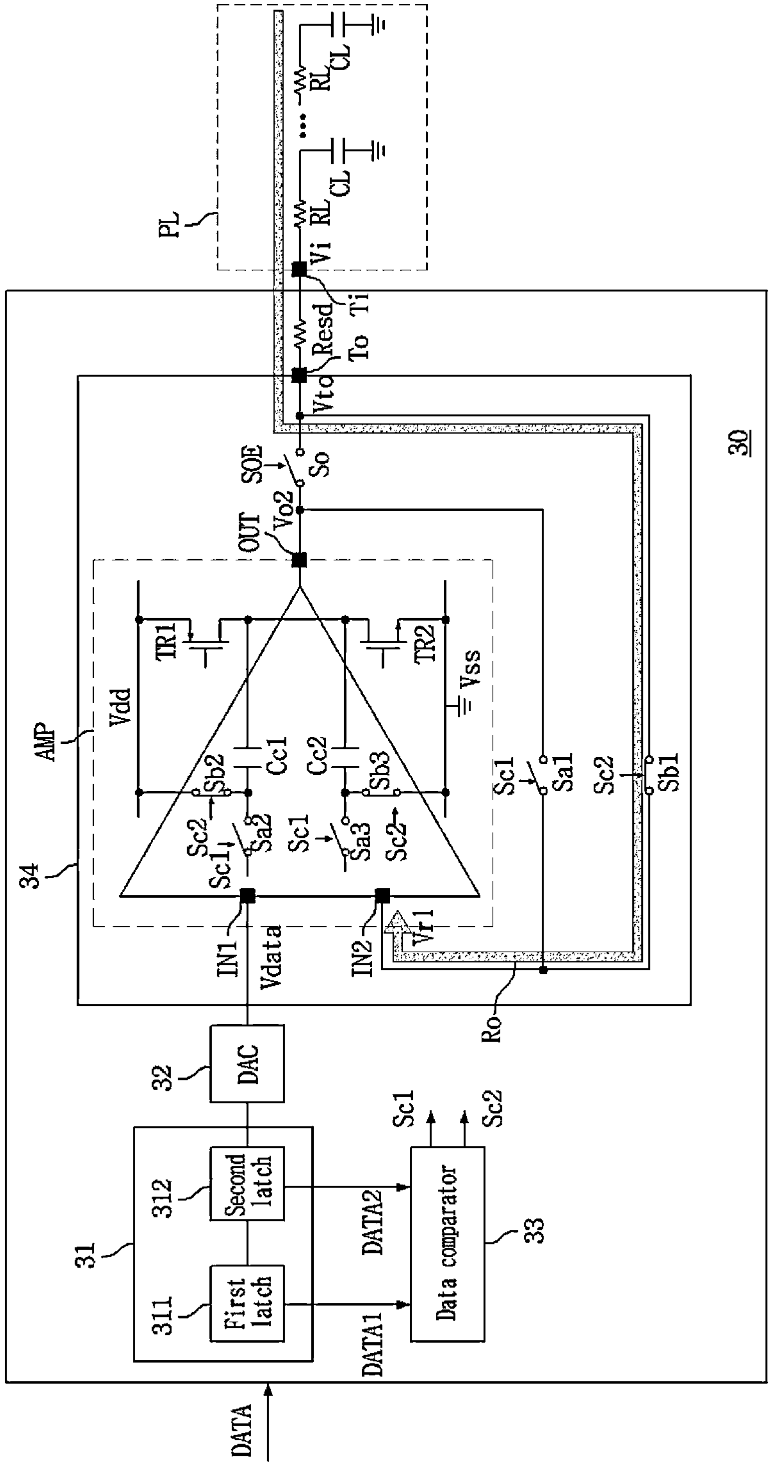
FIG. 4 is a diagram illustrating a case where the slew rate controller in accordance with the embodiment operates as a comparator.

FIG. 4 is a diagram illustrating a case where the slew rate controller in accordance with the embodiment operates as a comparator.

Figure 5:
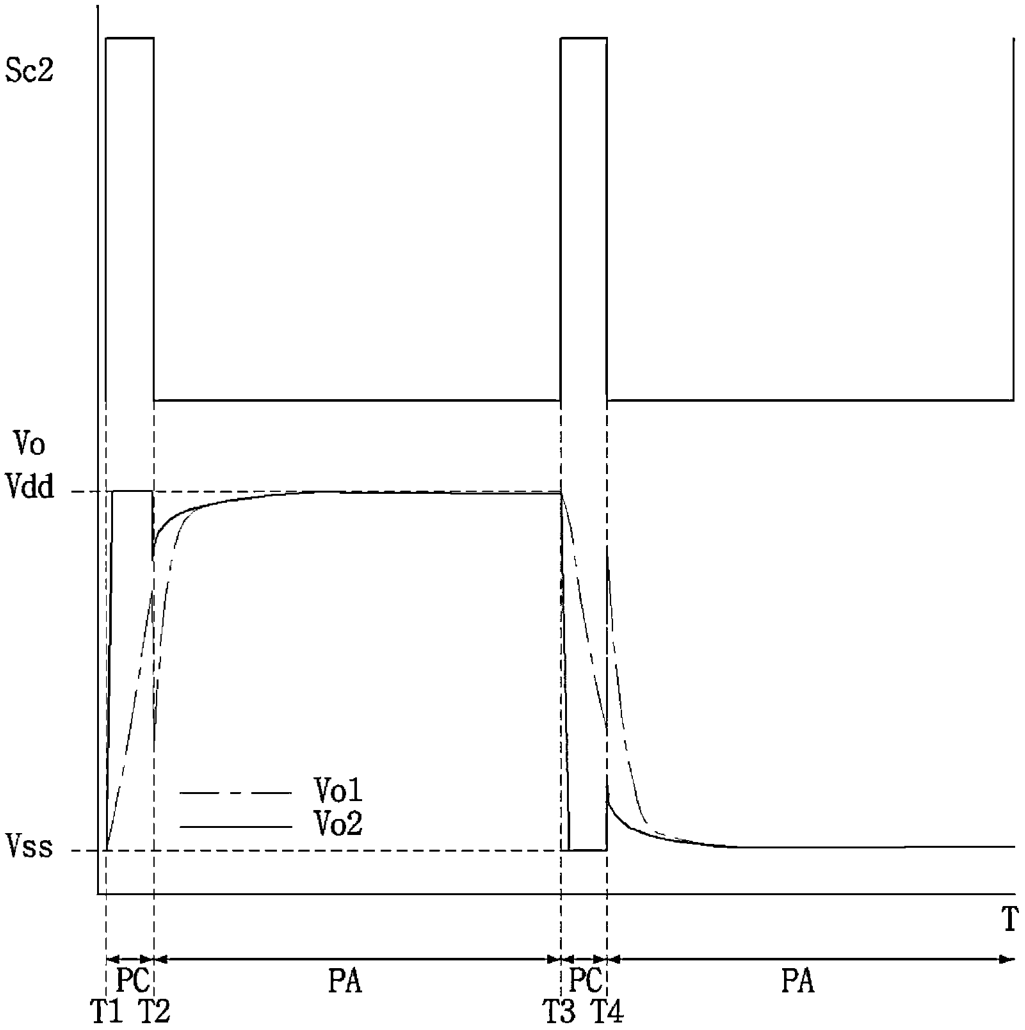
FIG. 5 is a graph illustrating a second control signal and the output voltage of an amplifier in accordance with an embodiment.

FIG. 5 is a graph illustrating a second control signal and the output voltage of an amplifier in accordance with an embodiment.

Figure 6:
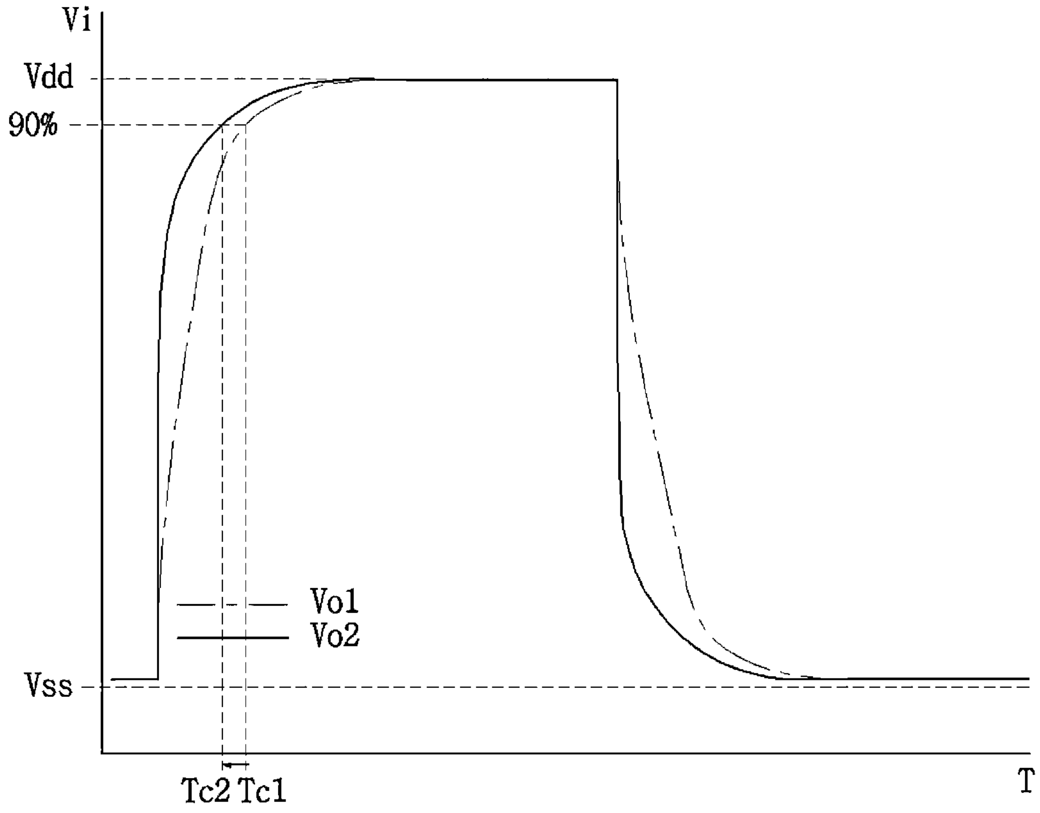
FIG. 6 is a graph illustrating the input voltage of a display panel in accordance with an embodiment.

FIG. 6 is a graph illustrating the input voltage of a panel load in accordance with an embodiment.

Referring to FIGS. 4 and 5, When the difference between the first display data DATA1 and the second display data DATA2 exceeds the preset value, at a first time point T1, the second control signal Sc2 becomes an enable level. According to the second control signal Sc2 of an enable level, the switch Sb1, the switch Sb2 and the switch Sb3 are turned on. The operations of the switch Sa1, the switch Sa2 and the switch Sa3 according to the first control signal Sc1 are turned off. A path Ro including the turned-on switch Sb1 and the protection resistor Resd may be formed from the input terminal Ti to the second input terminal IN2. The voltage stored in the plurality of parasitic capacitors CL is applied as a second input voltage Vr1 to the second input terminal IN2 through the path Ro.

The amplifier AMP may operate as the comparator which generates the output voltage Vo (see FIG. 2) according to the difference between the first input voltage Vdata (see FIG. 2) and the second input voltage Vr1. For example, in the case where the first input voltage Vdata is larger than a reference voltage when the second input voltage Vr1 serves as the reference voltage, the amplifier AMP may generate the first driving voltage Vdd as an output voltage Vo2. Also, when the first input voltage Vdata is equal to or smaller than the reference voltage, the amplifier AMP may generate the second driving voltage Vss as the output voltage Vo2.

At a second time point T2, the second control signal Sc2 becomes a disable level. According to the second control signal Sc2 of a disable level, the switch Sb1, the switch Sb2 and the switch Sb3 are turned off. The operations of the switch Sa1, the switch Sa2 and the switch Sa3 according to the first control signal Sc1 are turned on as described above with reference to FIG. 3, and the amplifier AMP operates as the buffer.

For illustration, one horizontal period can be divided into a comparator period PC and amplifier period PA. The comparator period PC corresponds to the initial period of the horizontal period in which the source output enable signal SOE is at the enable level, the amplifier period PA corresponds to the remaining period of the horizontal period in which the source output enable signal SOE is at the disable level.

When the amplifier AMP drives the second image data voltage Vdata2 corresponding to the second display data DATA2 in a previous horizontal period, the amplifier AMP drives the first image data voltage Vdata1 corresponding to the first display data DATA1 in a current horizontal period.

During the amplifier period PA of the previous horizontal period, the amplifier AMP may charge the plurality of parasitic capacitors CL by using the second image data voltage Vdata2 corresponding to the second display data DATA2.

During the comparator period PC of the current horizontal period, the amplifier AMP may be applied with the first image data voltage Vdata1 corresponding to the first display data DATA1, through the first input terminal IN1. The first image data voltage Vdata1 is an image data voltage which is applied from the DAC 32 in the current horizontal period. The amplifier AMP may generate the output voltage Vo2 according to a result of comparing the second image data voltage Vdata1 of the first input terminal IN1 and the second input voltage Vr1 of the second input terminal. The second input voltage Vr1 corresponds to the charging voltage of the plurality of parasitic capacitors CL which are charged in the previous horizontal period. For example, when the second image data voltage Vdata1 is larger than the second input voltage Vr1, the amplifier AMP may generate the first driving voltage Vdd as the output voltage Vo2. When the second image data voltage Vdata1 is equal to or smaller than the second input voltage Vr1, the amplifier AMP may generate the second driving voltage Vss as the output voltage Vo2.

Accordingly, when the difference between the first display data DATA1 and the second display data DATA2 exceeds the preset value, the slew rate controller 34 may operate as a comparator during the comparator period PC and operate as an output buffer during the amplifier period PA.

Therefore, when the difference between the first display data DATA1 and the second display data DATA2 exceeds the preset value, the slew rate controller 34 operates as a comparator during the comparator period PC and settles the output voltage Vo2 as the first driving voltage Vdd or the second driving voltage Vss. As a result, it may be seen that the time for driving the output voltage Vo2 corresponding to the first display data may be reduced during the current horizontal period and the slew rate of the output voltage Vo2 is improved.

Referring to FIG. 6, it may be seen that a time till the input voltage Vi of the panel load PL becomes 90% is shorter in the case a time point Tc2 when the slew rate controller 34 operates as a comparator than a time point Tc1 when the slew rate controller 34 does not operate as a comparator.

Hereinafter, a method for the slew rate controller 34 in accordance with the embodiment to control the comparator period PC will be described with reference to FIG. 7.

Figure 7:
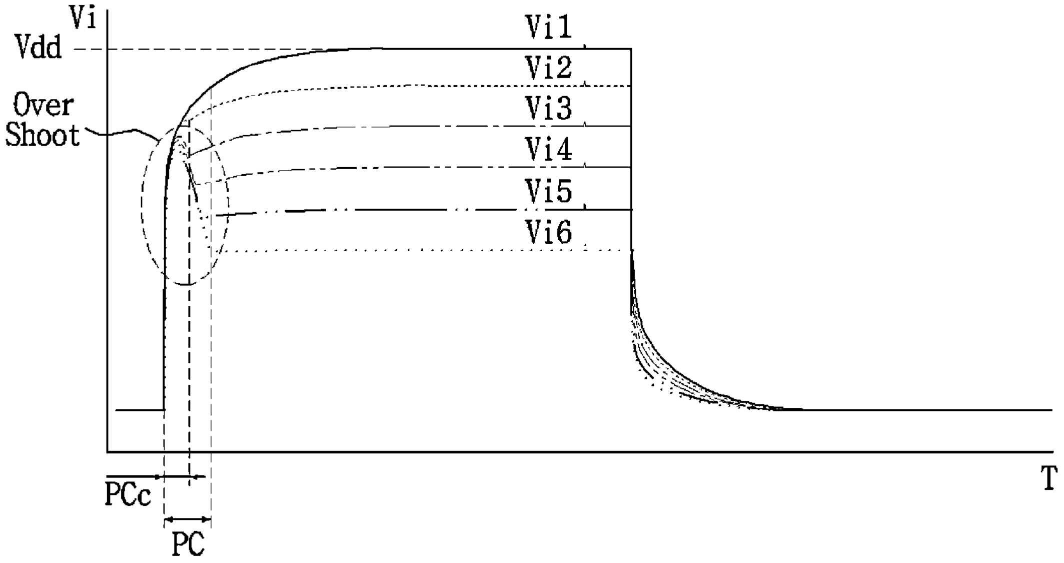
FIG. 7 is a graph illustrating an overshoot phenomenon due to the output voltage of the slew rate controller in accordance with the embodiment.

FIG. 7 is a graph illustrating an overshoot phenomenon due to the output voltage of the slew rate controller in accordance with the embodiment.

Referring to FIG. 7, an overshoot does not occur in an input voltage Vi1 when the panel load PL is fully charged to the first driving voltage Vdd, but an overshoot may occur in each of an input voltage Vi2, an input voltage Vi3, an input voltage Vi4, an input voltage Vi5 and an input voltage Vi6 lower than the input voltage Vi1.

Accordingly, the slew rate controller 34 may control the comparator period PC in proportion to the magnitude of the input voltage Vi inputted to the panel load PL. For example, in the input voltage Vi1, the slew rate controller 34 may set a period the same as a period in which the source output enable signal SOE is at an enable level, as the comparator period PC. In addition, according to the magnitude of the voltage of each of the plurality of input voltages Vi2, Vi3, Vi4, Vi5 and Vi6, the slew rate controller 34 may set a comparator period PCc as a period shorter than a period in which the source output enable signal SOE is at an enable level. Namely, the slew rate controller 34 may control the enable level periods of the first control signal Sc1 and the second control signal Sc2 in correspondence to the input voltage Vi.

Hereinafter, a method for driving a slew rate controller in accordance with an embodiment will be described with reference to FIG. 8.

Figure 8:
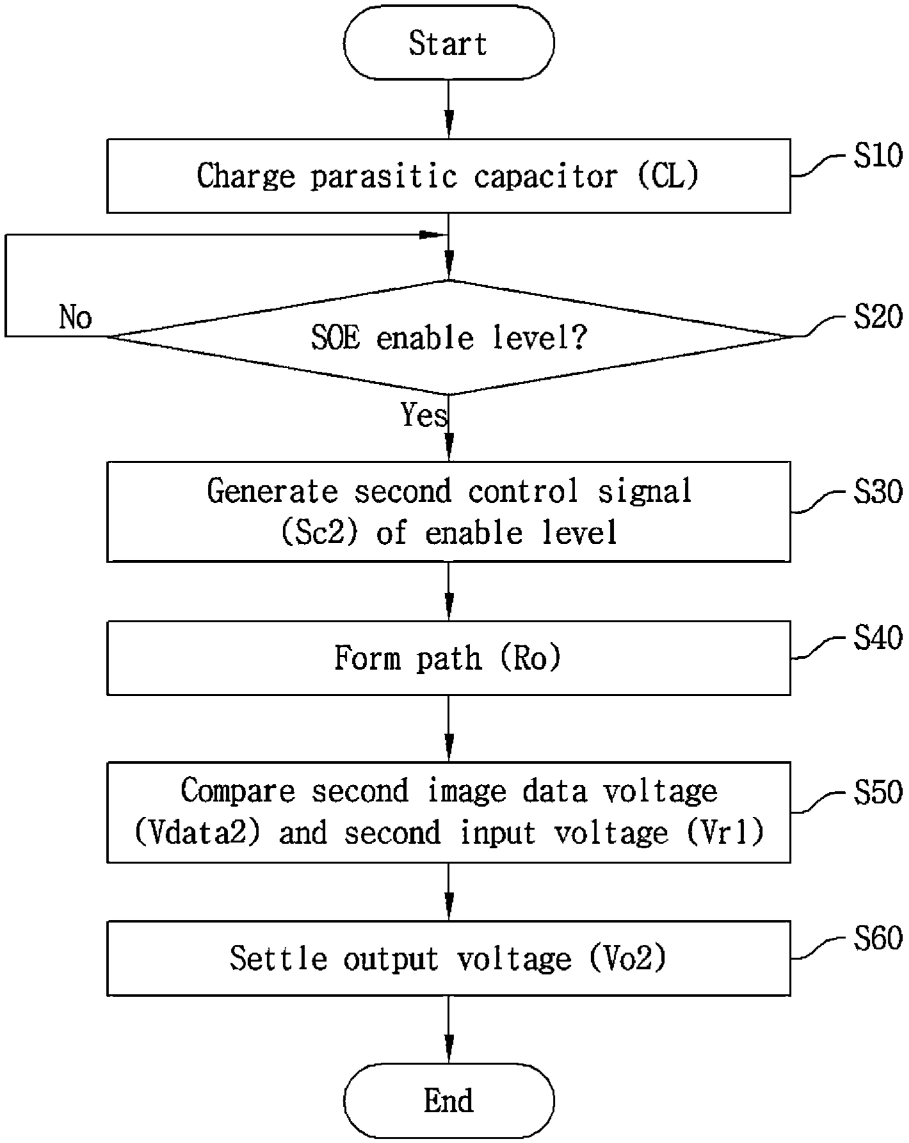
FIG. 8 is a flowchart illustrating a method for driving a slew rate controller in accordance with an embodiment.

FIG. 8 is a flowchart illustrating a method for driving a slew rate controller in accordance with an embodiment.

At step S10, the plurality of parasitic capacitors CL are charged by the second image data voltage Vdata2 corresponding to the previous horizontal period (e.g., the (n−1)th horizontal period).

At step S20, the slew rate controller 34 determines whether the source output enable signal SOE is at an enable level.

At step S30, the slew rate controller 34 generates the second control signal Sc2 of an enable level by being synchronized with the time point T1 at which the source output enable signal SOE becomes an enable level.

At step S40, according to the second control signal Sc2 of an enable level, the switch Sb1, the switch Sb2 and the switch Sb3 are turned on. The path Ro including the turned-on switch Sb1 and the protection resistor Resd is formed from the input terminal Ti to the second input terminal IN2.

At step S50, the slew rate controller 34 may compare the second input voltage Vr1 inputted along the path Ro with the first image data voltage Vdata1.

The second input voltage Vr1 is a voltage corresponding to a voltage charged in the panel load PL in the previous horizontal period. The first image data voltage Vdata1 is an image data voltage which is applied from the DAC 32 in the current horizontal period.

At step S60, when the first image data voltage Vdata1 is larger than the second input voltage Vr1, the slew rate controller 34 generates the first driving voltage Vdd as the output voltage Vo2. When the first image data voltage Vdata1 is equal to or smaller than the second input voltage Vr1, the slew rate controller 34 generates the second driving voltage Vss as the output voltage Vo2.

While the disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A slew rate controller comprising:

an amplifier configured to operate with a first driving voltage and a second driving voltage, and include a first input terminal applied a first input voltage, a second input terminal applied a second input voltage and an output terminal outputting an output voltage;

an output switch configured to turn-off in a first period and turn-on in a second period during a horizontal period including the initial first period and the remaining second period, and apply the output voltage to an external panel load in the second period;

a first switch configured to switch a connection between the output terminal and the second input terminal of the amplifier, and turn-on during the second period; and a second switch configured to switch a connection between an external panel load and the second input terminal of the amplifier, and turn-on during the first period, wherein, when a difference between a first display data corresponding to the first input voltage and a second display data corresponding to a voltage charged to the panel load exceeds the preset value, the amplifier settles the output voltage of the output terminal as the first driving voltage or the second driving voltage during the first period.

2. The slew rate controller according to claim 1, wherein the amplifier further configured to:

during the first period, output the first driving voltage as the output voltage, when the first input voltage is larger than the second input voltage, and output the second driving voltage as the output voltage, when the first input voltage is equal to or smaller than the second input voltage, and wherein the first driving voltage is a voltage higher than the second driving voltage.

3. The slew rate controller according to claim 1, wherein switching of the output switch is controlled according to a source output enable signal dividing the first period and the second period, switching of the first switch is controlled according to a first control signal, switching of the second switch is controlled according to a second control signal, and the second control signal becomes an enable level when a difference between the first display data and the second display data exceeds the preset value.

4. The slew rate controller according to claim 3, wherein the first control signal and the second control signal have opposite phases.

5. The slew rate controller according to claim 3, wherein the first control signal and the second control signal are synchronized at the level transition timing of the source output enable signal, and the source output enable signal and the second control signal have the same phase.

6. The slew rate controller according to claim 3, wherein the amplifier further comprises:

a first capacitor including one end which is corresponded to the first input terminal and the other end which is connected to the output terminal; and a second capacitor including one end which is corresponded to the second input terminal and the other end which is connected to the output terminal, and wherein the one end of the first capacitor is connected to the first driving voltage, and the one end of the second capacitor is connected to the second driving voltage.

7. The slew rate controller according to claim 6, wherein the amplifier further comprises:

a third switch connected between the one end of the first capacitor and the first driving voltage; and a fourth switch connected between the one end of the second capacitor and the second driving voltage, and wherein switching of the third switch and the fourth switch is controlled according to the second control signal.

8. The slew rate controller according to claim 7, wherein the amplifier further comprises:

a fifth switch connected to the one end of the first capacitor; and a sixth switch connected to the one end of the second capacitor, and wherein switching of the fifth switch and the sixth switch is controlled according to the first control signal.

9. A method for controlling a slew rate controller including an amplifier, which operates with a first driving voltage and a second driving voltage and includes a first input terminal, a second input terminal and an output terminal, an output switch, a first switch and a second switch, the method comprising:

operating the amplifier as a comparator, in a first period of a horizontal period which includes the initial first period and the remaining second period, according to turn-off of the output switch and turn-on of the second switch which connects the second input terminal and an external panel load; and operating the amplifier as a buffer, in the second period, according to turn-on of the output switch and the first switch which connects the second input terminal and the output terminal of the amplifier, wherein, when a difference between a first display data corresponding to a first input voltage of the first input terminal and a second display data corresponding to a voltage charged to the panel load exceeds the preset value, the amplifier operates as the comparator.

10. The method according to claim 9, wherein, when the difference between a first display data and the second display data is equal to or smaller the preset value, the amplifier operates as the comparator.

11. A data driver comprising:

a latch circuit configured to include a first latch and a second latch, and sequentially latch the display data of continuous horizontal periods;

a data comparator configured to compare a first display data of the first latch and a second display data of the second latch;

a digital analog converter configured to output an image data voltage corresponding to the second display data; and a slew rate controller configured to receive the image data voltage as a first input voltage and be connected to an external panel load;

wherein the slew rate controller comprises:

an amplifier configured to operate with a first driving voltage and a second driving voltage, and include a first input terminal applied the first input voltage, a second input terminal applied a second input voltage and an output terminal outputting an output voltage;

an output switch configured to turn-off in a first period and turn-on in a second period during a horizontal period including the initial first period and the remaining second period, and apply the output voltage to an external panel load in the second period;

a first switch configured to switch a connection between the output terminal and the second input terminal of the amplifier, and turn-on during the second period; and a second switch configured to switch a connection between the external panel load and the second input terminal of the amplifier, and turn-on during the first period, wherein, when a difference between the first display data corresponding to the first input voltage and the second display data corresponding to a voltage charged to the panel load exceeds the preset value, the slew rate controller settles the output voltage of the output terminal of the amplifier as the first driving voltage or the second driving voltage during the first period by operating as a comparator.

12. The data driver according to claim 11, wherein the amplifier, in the first period, outputting the first driving voltage as the output voltage when the first input voltage is larger than the second input voltage; and outputting the second driving voltage as the output voltage when the first input voltage is equal to or smaller than the second input voltage;

wherein the first driving voltage is a voltage higher than the second driving voltage.

13. The data driver according to claim 11, wherein switching of the output switch is controlled according to a source output enable signal dividing the first period and the second period, the data comparator provides a first control signal and a second control signal corresponding to the difference between the first display data corresponding to the first input voltage and the second display data corresponding to the voltage charged to the panel load, switching of the first switch is controlled according to the first control signal, switching of the second switch is controlled according to the second control signal, and the second control signal becomes an enable level when a difference between the first display data and the second display data exceeds the preset value.

14. The data driver according to claim 13, wherein the first control signal and the second control signal have opposite phases.

15. The data driver according to claim 13, wherein the first control signal and the second control signal are synchronized at the level transition timing of the source output enable signal, and the source output enable signal and the second control signal have the same phase.

16. The data driver according to claim 13, wherein the amplifier further comprises:

a first capacitor including one end which is corresponded to the first input terminal and the other end which is connected to the output terminal; and a second capacitor including one end which is corresponded to the second input terminal and the other end which is connected to the output terminal, and wherein the one end of the first capacitor is connected to the first driving voltage, and the one end of the second capacitor is connected to the second driving voltage.

17. The data driver according to claim 16, wherein the amplifier further comprises:

a third switch connected between the one end of the first capacitor and the first driving voltage; and a fourth switch connected between the one end of the second capacitor and the second driving voltage, and wherein switching of the third switch and the fourth switch is controlled according to the second control signal.

18. The data driver according to claim 17, wherein the amplifier further comprises:

a fifth switch connected to the one end of the first capacitor; and a sixth switch connected to the one end of the second capacitor, and wherein switching of the fifth switch and the sixth switch is controlled according to the first control signal.

19. A method for controlling a data driver, the method comprising:

a first step of determining by a data comparator whether a difference between a first display data of a first latch and a second display data of a second latch exceeds the preset value;

a second step of operating a slew rate controller as a buffer or a comparator in according to the determining of the data comparator, wherein the slew rate controller includes an amplifier, an output switch, a first switch and a second switch, and the amplifier operates with a first driving voltage and a second driving voltage and includes a first input terminal, a second input terminal and an output terminal, wherein the second step comprising:

a third step of operating the amplifier as a comparator, in a first period of a horizontal period which includes the initial first period and the remaining second period, according to turn-off of the output switch and turn-on of the second switch which connects the second input terminal and an external panel load; and a forth step of operating the amplifier as a buffer, in the second period, according to turn-on of the output switch and the first switch which connects the second input terminal and the output terminal of the amplifier, wherein, when a difference between a first display data corresponding to a first input voltage of the first input terminal and a second display data corresponding to a voltage charged to the panel load exceeds the preset value, the amplifier operates as the comparator.

20. The method according to claim 19, wherein, when the difference between a first display data and the second display data is equal to or smaller the preset value, the amplifier operates as the comparator.

* * * * *